(12) United States Patent
Okafuji et al.

(10) Patent No.: US 9,205,528 B2
(45) Date of Patent: Dec. 8, 2015

(54) ELECTRONIC GRADE GLASS SUBSTRATE AND MAKING METHOD

(71) Applicant: SHIN-ETSU CHEMICAL CO., LTD., Tokyo (JP)

(72) Inventors: Daiyu Okafuji, Joetsu (JP); Hiroyuki Yamazaki, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 239 days.

(21) Appl. No.: 13/659,137

(22) Filed: Oct. 24, 2012

(65) Prior Publication Data

US 2013/0101790 A1    Apr. 25, 2013

(30) Foreign Application Priority Data

Oct. 24, 2011    (JP) .................. 2011-232522

(51) Int. Cl.

| | |
|---|---|
| *B32B 3/00* | (2006.01) |
| *B32B 3/02* | (2006.01) |
| *B24B 37/04* | (2012.01) |
| *G03F 1/60* | (2012.01) |
| *B24B 37/02* | (2012.01) |
| *B24B 1/00* | (2006.01) |
| *B24B 5/50* | (2006.01) |
| *B24B 7/22* | (2006.01) |
| *B24B 9/06* | (2006.01) |

(52) U.S. Cl.
CPC ................. *B24B 37/042* (2013.01); *B24B 1/00* (2013.01); *B24B 5/50* (2013.01); *B24B 7/228* (2013.01); *B24B 9/065* (2013.01); *B24B 37/02* (2013.01); *G03F 1/60* (2013.01); *Y10T 428/24355* (2015.01); *Y10T 428/24479* (2015.01)

(58) Field of Classification Search
CPC ......... G03F 1/60; B24B 37/02; B24B 37/042; B24B 1/00; B24B 7/228; B24B 9/065; B24B 5/50; B24B 49/16; B24B 7/24; B24B 9/08
USPC .............. 428/141, 156, 157, 192, 167, 60
See application file for complete search history.

(56) References Cited

U.S. PATENT DOCUMENTS

| | | | |
|---|---|---|---|
| 4,956,249 A | 9/1990 | Kato et al. | |
| 6,165,407 A * | 12/2000 | Tahara et al. | 264/328.1 |
| 2008/0160129 A1 | 7/2008 | Resnick et al. | |

(Continued)

FOREIGN PATENT DOCUMENTS

| | | |
|---|---|---|
| EP | 0338749 A2 | 10/1989 |
| JP | 3-054569 A | 3/1991 |

(Continued)

OTHER PUBLICATIONS

Japanese Office Action dated Jul. 1, 2014, issued in corresponding application No. 2011-232522 (4 pages).

(Continued)

*Primary Examiner* — Catherine A Simone
(74) *Attorney, Agent, or Firm* — Westerman, Hattori, Daniels & Adrian, LLP (57) ABSTRACT

An electronic grade glass substrate is provided with a recess, channel or step in one surface, and a first chamfer between the side surface of the recess, channel or step and the one surface. The side and bottom surfaces of the recess, channel or step are mirror finished, and the first chamfer is mirror finished.

16 Claims, 5 Drawing Sheets

(56) References Cited

U.S. PATENT DOCUMENTS

| | | |
|---|---|---|
| 2009/0102020 A1 | 4/2009 | Sugawara et al. |
| 2010/0029185 A1 | 2/2010 | Fukuda et al. |
| 2010/0291257 A1 | 11/2010 | Resnick et al. |

FOREIGN PATENT DOCUMENTS

| | | |
|---|---|---|
| JP | 9-238325 A | 9/1997 |
| JP | 9-328325 A | 12/1997 |
| JP | 11-95411 A | 4/1999 |
| JP | 11-109607 A | 4/1999 |
| JP | 2005-333124 A | 12/2005 |
| JP | 2006-19464 A | 1/2006 |
| JP | 2008-103512 A | 5/2008 |
| JP | 2008-221516 A | 9/2008 |
| JP | 2009-13048 A | 1/2009 |
| JP | 2009-214275 A | 9/2009 |
| JP | 2009-536591 A | 10/2009 |
| JP | 2009-282111 A | 12/2009 |

OTHER PUBLICATIONS

Extended European Search Report dated Mar. 11, 2013, issued in corresponding European patent Application No. 12189416.

Japanese Office Action dated Jan. 20, 2015, issued in Japanese Application No. 2011-232522. (2 pages).

* cited by examiner

ELECTRONIC GRADE GLASS SUBSTRATE AND MAKING METHOD

CROSS-REFERENCE TO RELATED APPLICATION

This non-provisional application claims priority under 35 U.S.C. §119(a) on Patent Application No. 2011-232522 filed in Japan on Oct. 24, 2011, the entire contents of which are hereby incorporated by reference.

TECHNICAL FIELD

This invention relates to electronic grade glass substrates having a recess, channel or step, and more particularly, to glass substrates for use in the advanced applications of semiconductor-related electronic materials, typically as photomasks, exposure tool components, reticles and nanoimprint molds. It also relates to a method for manufacturing the same.

BACKGROUND ART

The quality of electronic grade glass substrates is evaluated in terms of the size and population of defects on the substrate, flatness, surface roughness, photochemical stability of material, and surface chemical stability. The trend toward higher accuracy of the design rule poses ever-tightening requirements on these factors.

Photomask substrates used in the fabrication of microelectronic devices must have a high accuracy of shape or topography. If a substrate has a poor accuracy of shape or a certain degree of distortion, exposure through the mask entails a focal shift on a silicon wafer to aggravate pattern uniformity, failing to form a fine feature pattern. In the lithography using ArF laser light source of 193 nm wavelength which is the current mainstream of microelectronic lithography and the EUV lithography using a light source of 13.5 nm wavelength in the soft x-ray wavelength range on which development efforts are made as the next generation lithography, glass substrates for photomasks and reflection masks are required to have a high level of topographical factors including flatness, parallelism, and contour tolerance (as to flatness, see JP-A 2008-103512). The same applies to photomask substrates on the array side of TFT liquid crystal panels and photomask substrates for color filters.

Research works have also been made on the nanoimprint lithography (NIL) which is a low cost, simple, high resolution process as compared with the conventional exposure processes. The NIL also needs a substrate having a high accuracy of shape as the imprint mold. The NIL is a technique of imprinting a nano-structured pattern to a resin for pattern transfer. The resolution of the pattern to be transferred depends on the resolution of nano-structures on the mold. Then the substrate on which a fine feature pattern is formed is required to have a high accuracy of shape (see JP-A H03-54569).

Besides, the synthetic quartz glass members to be assembled in exposure tools and various other equipment used in the processes of manufacturing microelectronic components are also required to have a high purity and accuracy.

CITATION LIST

Patent Document 1: JP-A 2008-103512
Patent Document 2: JP-A H03-54569
Patent Document 3: JP-A 2009-536591

SUMMARY OF INVENTION

An object of the invention is to provide an electronic grade glass substrate having a recess, channel or step in which the bottom and side surfaces of the recess, channel or step are mirror finished, and shape factors including size, bottom wall thickness, and parallelism are consistently controlled at a high accuracy so that the substrate is unsusceptible to fissure and chipping at the recess, channel or step and has a high strength and cleanness. Another object is to provide a method of manufacturing the glass substrate.

The inventors have found that the above problems are overcome by machining a glass substrate to form a recess, channel or step therein and chamfers at the corners associated with the recess, channel or step and polishing the bottom and side surfaces of the recess, channel or step and the chamfers to mirror finish. The substrate is so configured as to prevent the recess, channel or step from fissure or chipping at the corner. Thus the recess, channel or step is resistant to breakage even when repetitive loads and hence, substantial stresses are applied thereto.

More particularly, a glass substrate having a recess, channel or step is manufactured by machining the substrate to form a recess, channel or step, and polishing the side and bottom surfaces of the recess, channel or step to mirror finish. In the prior art shaping process, the machining step is carried out by moving the grinding wheel relative to the substrate vertically (that is, cutting down from above to below) rather than horizontally. This is problematic in that the recess, channel or step is susceptible to fissure and chipping at its edges or corners, and the corners are difficult to polish to mirror finish. When the substrate is mounted in a lithography or NIL apparatus, the substrate comes in physical contact with the apparatus, which can raise problems because the recess, channel or step is susceptible to fissure and chipping at its edges or corners.

It is assumed that a substrate has a pair of opposed major surfaces and an end surface or surfaces, and a recess, channel or step formed in the back surface has bottom and side surfaces or walls. On use of the substrate having a recess, channel or step formed in the back surface, the photomask or nanoimprint working process is applied to the front surface. The recess, channel or step is formed in the substrate back surface such that the distance between the front surface and the bottom surface of the recess, channel or step (also referred to as bottom wall thickness) may range from 0.05 to 80 mm, more preferably 0.05 to 11 mm, and correspond to 5 to 50%, more preferably 10 to 30% of the substrate thickness. The bottom wall thickness desirably has a low value within the range. The prior art configuration has the problem that because of difficulty of the machining and polishing steps, the corner between the side and bottom surfaces of the recess, channel or step has a potential of cracking, and it is difficult to maintain the strength at the bottom of the recess, channel or step in a consistent manner. This gives rise to the problem that the substrate can be relatively readily broken when repetitive loads are applied thereto. Thus the distance between the substrate front surface and the bottom surface of the recess, channel or step is relatively long (i.e., bottom wall is relatively thick) in the prior art.

Quite unexpectedly, by chamfering the corner or edge between the side and bottom surfaces of the recess, channel or step and polishing all the side and bottom surfaces and the chamfer to mirror finish, formation of fissure or chipping at the corner is restrained. When the chamfer between the side and bottom surfaces of the recess, channel or step is provided as a curvilinear chamfer, the strength of a recess, channel or step-defining portion extending from the side surface to the bottom surface is enhanced by the curvilinear chamfer. Even when the distance between the substrate front surface and the bottom surface of the recess or channel or the distance between the substrate back surface and the bottom surface of the step is relatively short (i.e., bottom wall is relatively thin), the substrate is fully resistant to breakage upon repetitive application of substantial loads, that is, withstands substantial stresses, as will be demonstrated in Examples.

In one aspect, the invention provides an electronic grade glass substrate wherein a recess, channel or step is disposed in at least one surface of the substrate, the recess, channel or step having side and bottom surfaces, and a first chamfer is provided between the side surface of the recess, channel or step and the one surface of the substrate, the side and bottom surfaces of the recess, channel or step are mirror finished, and the first chamfer is mirror finished.

In a preferred embodiment, a second chamfer is provided between the side and bottom surfaces of the recess, channel or step, and the second chamfer is defined by a curved surface having a radius of curvature of 0.1 to 5.0 mm and mirror finished. Also preferably, a third chamfer is provided between the bottom surface of the step and an end surface of the substrate, and the third chamfer is mirror finished.

In preferred embodiments, the side and bottom surfaces of the recess, channel or step and the chamfers have a surface roughness (Ra) of up to 1 nm; the bottom surface of the recess, channel or step has a strength of at least 20 MPa; the bottom surface of the recess, channel or step has a flatness of 0.01 to 40 μm; the bottom surface of the recess, channel or step has a parallelism of up to 100 μm.

In another aspect, the invention provides a method for manufacturing an electronic grade synthetic quartz glass substrate, comprising the steps of:

machining at least one surface of a glass substrate to form a recess, channel or step in the one surface, the recess, channel or step having side and bottom surfaces, and to form at least one chamfer selected from among a first chamfer between the side surface of the recess, channel or step and the one surface of the substrate, a second chamfer between the side and bottom surfaces of the recess, channel or step, the second chamfer being a curved surface having a radius of curvature of 0.1 to 5.0 mm, and a third chamfer between the bottom surface of the step and an end surface of the substrate, and polishing the side and bottom surfaces of the recess, channel or step and the chamfer to mirror finish by a working portion of a rotary polishing tool having a Young's modulus of up to 7 GPa while keeping the working portion in contact with the side and bottom surfaces and the chamfer under independent constant pressures.

In a preferred embodiment, the mirror finish polishing step includes keeping the working portion of the rotary polishing tool in contact with the bottom and side surfaces of the recess, channel or step and the chamfer under independent constant pressures in the range of 1 to 1,000,000 Pa.

In the mirror finish polishing step, preferably the working portion of the rotary polishing tool is kept in concurrent contact with the bottom and side surfaces of the recess, channel or step and the chamfer under independent pressures; the rotary polishing tool and the substrate are relatively moved such that the working portion may follow the profile of the recess, channel or step and the chamfer in the substrate; or the rotary polishing tool is rotated about the recess or a substrate-holding platform is rotated such that the working portion may follow the profile of the recess, channel or step and the chamfer in the substrate.

Advantageous Effects of Invention

The invention is useful in the manufacture of an electronic grade synthetic quartz glass substrate having a recess, channel or step, for example, a synthetic quartz glass substrate for use as a photomask substrate in the photolithography or a mold substrate in the nanoimprint lithography (NIL) for the fabrication of IC and other electronic devices. In the electronic grade glass substrate having a recess, channel or step, the bottom and side surfaces of the recess, channel or step are mirror finished, and shape factors are consistently controlled at a high accuracy. Thus the substrate is unsusceptible to fissure and chipping at the recess, channel or step and has a high strength and cleanness.

Since the corner between the side and bottom surfaces of the recess, channel or step where the maximum stress is exerted when a load is applied to the recess, channel or step is curvilinear chamfered, the strength of the bottom wall is increased. Even when a certain load is applied to the recess, channel or step to introduce a change in its shape, the bottom wall is robust enough to prevent breakage.

DESCRIPTION OF EMBODIMENTS

In the following description, like reference characters designate like or corresponding parts throughout the several views shown in the figures. The singular forms "a", an and the include plural referents unless the context clearly dictates otherwise. It is also understood that terms such as "front," "back," and the like are words of convenience and are not to be construed as limiting terms. The term "recess" refers to a bore which does not penetrate throughout the substrate in its thickness direction, that is, terminates midway with a bottom wall left while the bore may be of circular, elliptic or rectangular shape in cross section.

Briefly stated, the invention provides a method for manufacturing an electronic grade glass substrate, comprising the steps of machining a glass substrate to form a recess, channel or step at a predetermined position, and polishing the bottom and side surfaces of the recess, channel or step to mirror finish while keeping a rotary polishing tool in contact with the bottom and side surfaces under independent constant pressures.

The glass substrate with which the method starts may be one prepared by any well-known techniques. If desired, the substrate may have a chromium or similar film deposited on its surface or a texture pattern of the order of nano-meter formed on its surface.

The glass substrate may be of rectangular or circular shape. The size of the glass substrate may vary over a wide range covering from small-size substrates for IC photomasks or NIL molds to large-size photomask substrates for large-size liquid crystal displays. For example, rectangular shape glass substrates may range from a size of 20 mm×20 mm to a size of 152 mm×152 mm, and even to a size of 1,000 mm×2,000 mm. For circular shape glass substrates, a wafer size having a diameter of 6 inches or 8 inches is preferably used.

Although the thickness of the substrate between the front and back surfaces may vary over a wide range, the substrate thickness is preferably 0.1 to 300 mm, more preferably 0.1 to 100 mm, and even more preferably 0.2 to 30 mm.

If necessary and preferably, the glass substrate is previously measured for flatness and parallelism for confirming the dimensional accuracy thereof. Measurement of flatness is preferably conducted, from the standpoint of measurement accuracy, by the optical interference method of directing coherent light, typically laser light to a substrate surface where it is reflected so that a difference in height of the substrate surface is observed as a phase shift of reflected light. Flatness may be measured using an interferometer Zygo Mark IVxp by Zygo Corporation, for example. Parallelism may also be measured by the same instrument.

It is preferred from the standpoint of pattern uniformity that the glass substrate prior to the machining step to form a recess, channel or step have a flatness of 0.01 to 30 µm, more preferably 0.01 to 2 µm, and even more preferably 0.01 to 0.5 µm on its front and back surfaces. Also preferably the substrate has a parallelism of 0.1 to 50 µm, more preferably 0.1 to 5 µm, and even more preferably 0.1 to 3 µm between its front and back surfaces.

The invention relates to a method for manufacturing an electronic grade synthetic quartz glass substrate wherein the glass substrate is provided with a recess, channel or step, depending on a particular application and the structure of a lithography or NIL equipment in which it is mounted.

Figure 1:
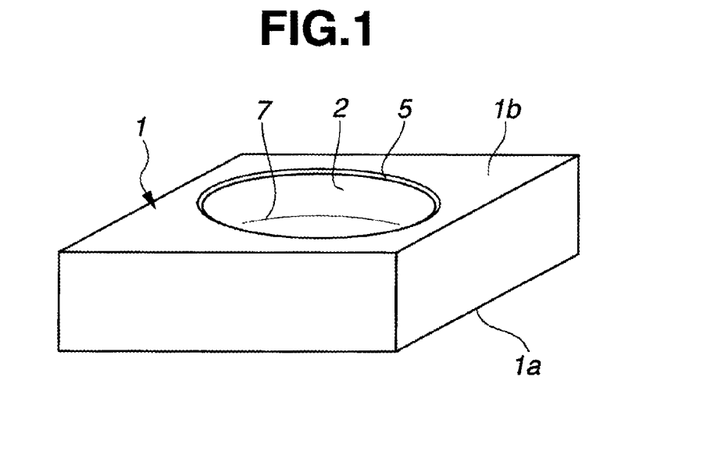
FIGS. 1 and 2 are perspective and cross-sectional views of a glass substrate having a recess in one embodiment of the invention, respectively.
Figure 2:
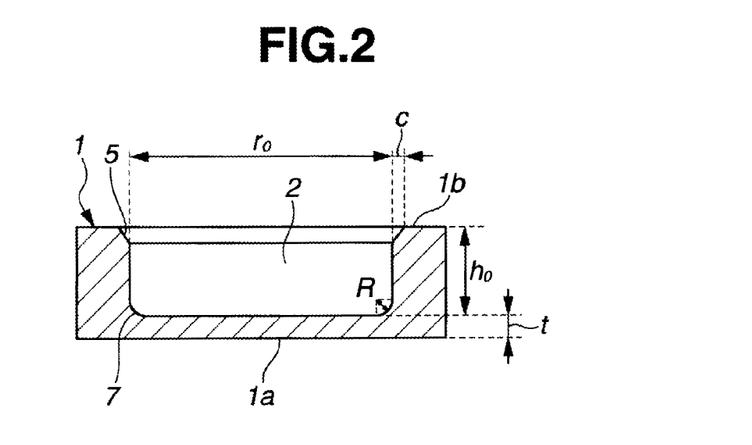
Figure 3:
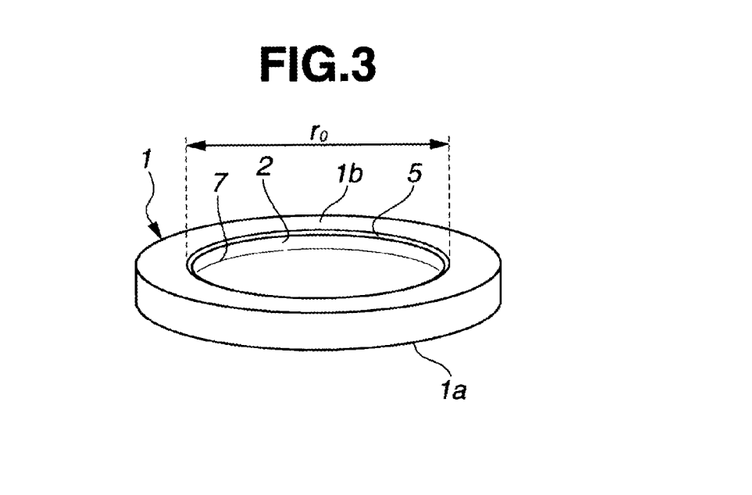
FIG. 3 is a perspective view of a glass substrate having a recess in one embodiment of the invention.
Figure 4:
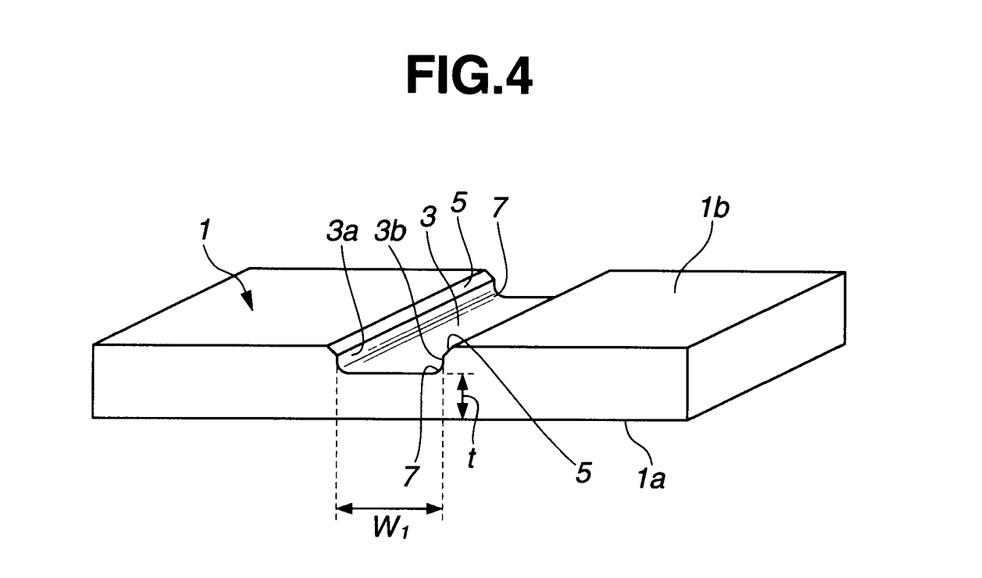
FIGS. 4 and 5 are perspective and cross-sectional views of a glass substrate having a channel in another embodiment of the invention, respectively.
Figure 5:
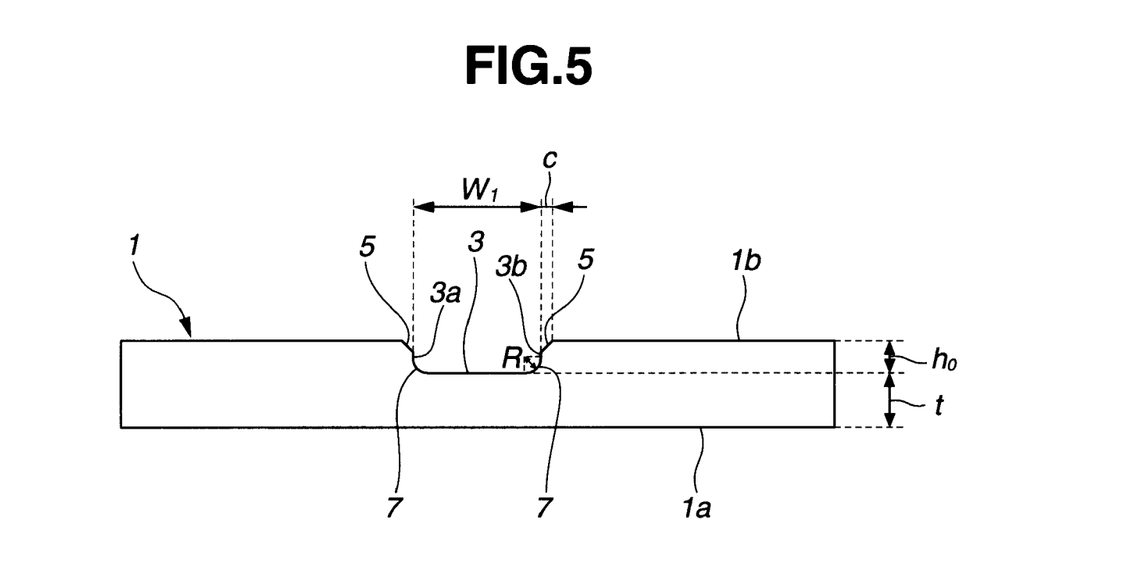
Figure 6:
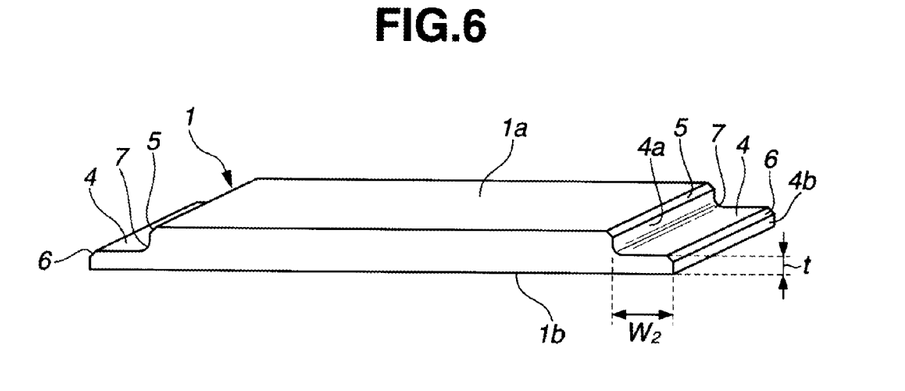
FIGS. 6 and 7 are perspective and cross-sectional views of a glass substrate having steps in a further embodiment of the invention, respectively.
Figure 7:
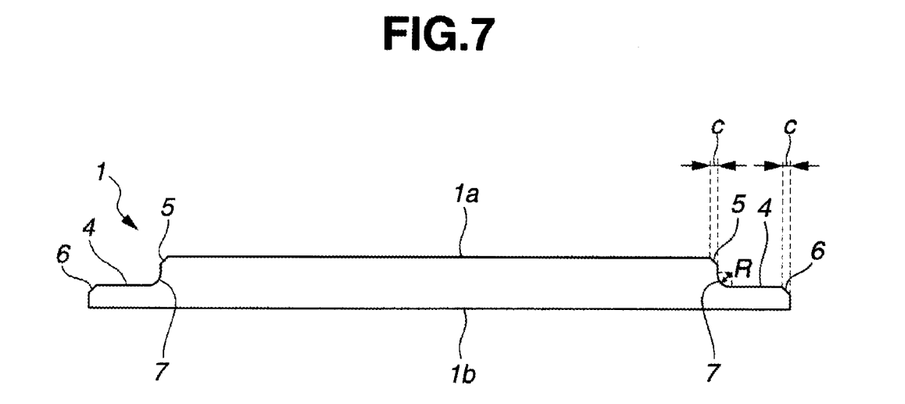
Figure 8:
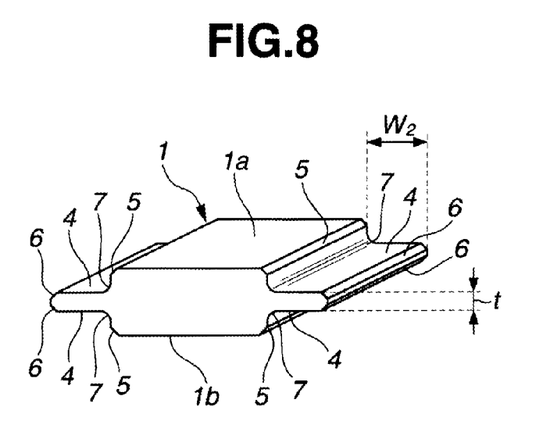
FIG. 8 is a perspective view of a glass substrate having steps in a still further embodiment of the invention.
Figure 9:
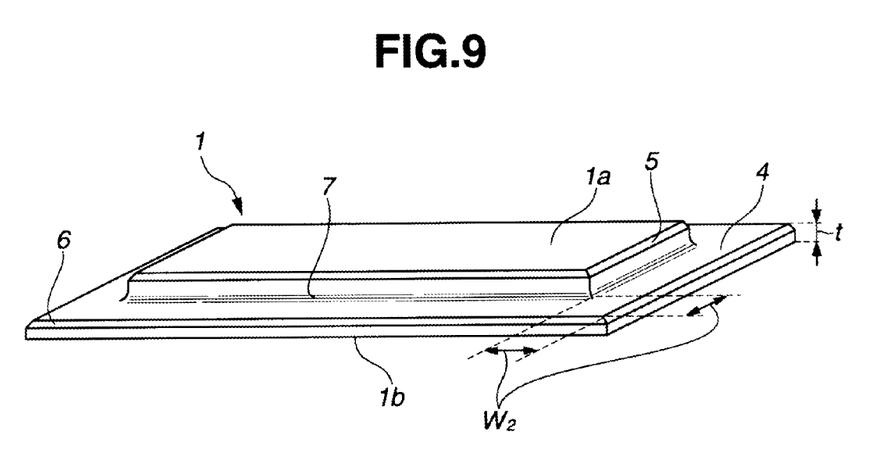
FIG. 9 is a perspective view of a glass substrate having steps in a still further embodiment of the invention.
Figure 10:
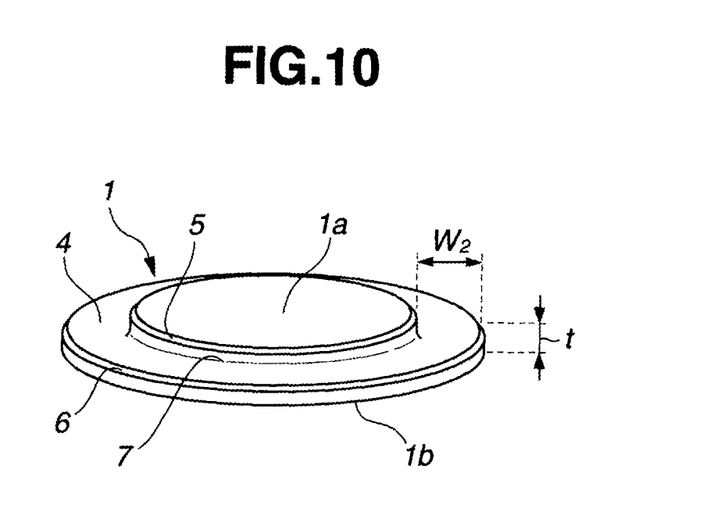
FIG. 10 is a perspective view of a glass substrate having steps in a still further embodiment of the invention.

Referring to the figures, a glass substrate 1 has a front surface 1a and a back surface 1b. In FIGS. 1 and 2, an electronic grade glass substrate 1 of rectangular shape is provided at its center with a recess 2. In FIG. 3, a glass substrate 1 of disk shape is provided at its center with a recess 2. In these embodiments, the recess 2 is formed in the back surface 1b of the substrate 1 whereas the front surface 1a of the substrate 1 is to be processed by the photomask or NIL technology. In FIGS. 4 and 5, a glass substrate 1 of rectangular shape is provided in the back surface 1b with a channel 3 which extends along a center in a width direction of the substrate. In FIGS. 6 and 7, a glass substrate 1 of rectangular shape is provided in the front surface 1a with steps 4 which extend along longitudinally opposed edges. The steps 4 may also be formed in the back surface 1b rather than the front surface 1a of the substrate 1. In FIG. 8, a glass substrate 1 of rectangular shape is provided in the front and back surfaces 1a and 1b with steps 4 which extend along longitudinally opposed edges. Furthermore, steps may be formed along the peripheral edges of a substrate, as shown in the embodiments of FIGS. 9 and 10. FIG. 9 illustrates an embodiment wherein steps 4 are formed along the peripheral edges of a rectangular substrate 1 whereas FIG. 10 illustrates another embodiment wherein a step 4 is formed along the peripheral edge of a circular substrate 1. Although steps 4 are formed in the front surface 1a of the substrate 1 in FIGS. 9 and 10, the steps may also be formed in the back surface 1b.

It is noted that two or more of a recess, channel and step may be formed in one surface of a substrate. Alternatively, any one of a recess, channel and step may be formed in one surface and a different one be formed in the other surface of a substrate.

It is noted that the recess is defined by a side surface and a bottom surface (see FIG. 2); the channel 3 is defined by opposed side surfaces 3a, 3b and a bottom surface (see FIG. 4); and the step 4 is defined by a side surface 4a and a bottom surface (see FIG. 6). The portion of the substrate which is left after the recess, channel or step is formed (as apparent from the cross-sectional view of FIG. 2) is referred to as "bottom wall." Differently stated, the term "bottom wall" is a substrate portion defined between the front surface 1a and the bottom surface of recess 2, channel 3 or step 4.

The shape of the recess may be circular, oval, ellipsoidal, rectangular or polygonal in planar shape. The circular shape is preferred as shown in FIGS. 1 and 3. The size of the recess is preferably in a range of 5 to 200 mm, in terms of diameter for circular shape, major diameter for oval or ellipsoidal shape, or diagonal length for rectangular shape. As to the channel, it is preferred that side walls 3a, 3b of channel 3 define parallel planes as shown in FIG. 4. However, the side walls of a channel need not be parallel; and one or both of the side walls of a channel may define a convex or concave curved surface. As to the step, it is preferred that an inside wall 4a of step 4 define a plane which is parallel to the substrate end surface connected to the free leading edge 4b of the step 4 as shown in FIG. 6. However, the inside wall 4a need not be parallel to the substrate end surface; and the inside wall 4a may define a convex or concave curved surface. Preferably the channel or step has a maximum width of 5 to 200 mm.

As seen from FIGS. 2, 5 and 7, the recess, channel or step is formed such that a first chamfer 5 is provided between the side surface of the recess, channel or step and the surface of the substrate where the recess, channel or step is formed. In the case of a step, a third chamfer 6 may be provided between the bottom surface of the step and the end surface of the substrate as shown in FIG. 7. The chamfer 5 or 6 has a width C which is preferably in the range of 0.01 to 5 mm, more preferably 0.05 to 1 mm, for the purposes of removing fine flaws or chips generated in the machining step, preventing the substrate from fissure or chipping by contact with another member, and so forth.

Preferably, the recess, channel or step is formed such that a second chamfer 7 may be provided between the side and bottom surfaces of the recess, channel or step as shown in FIGS. 2, 5 and 7. The second chamfer 7 is defined by a curved surface which preferably has a radius of curvature R of 0.1 to 5.0 mm, more preferably 0.2 to 2.0 mm, for the purposes of conferring sufficient strength to the bottom surface of the recess, channel or step, rounding and smoothing the corner for thereby preventing cracking or fissure during the machining step, allowing for easy access of the working edge of a mirror finishing tool for thereby facilitating mirror finishing, and so forth.

The depth of the recess, channel or step may be determined as appropriate depending on a particular application of the substrate. It is preferred for strength that the thickness ("t" in FIGS. 2, 5, 6, 8, 9 and 10) of the bottom wall be 0.05 to 80 mm, more preferably 0.05 to 29 mm, and even more preferably 0.05 to 11 mm, and correspond to 1 to 90%, more preferably 5 to 50%, and even more preferably 10 to 30% of the thickness of substrate 1.

In the event the substrate is used in the NIL, the recess 2 or channel 3 is formed in the back surface 1b of substrate 1 while the front surface 1a of substrate 1 opposed to the back surface 1b is provided with a nano-structured pattern for nano-imprinting. Also the steps 4 are formed in the front and/or back surface while the front surface is provided with a nano-structured pattern for nano-imprinting.

In the first step of machining a synthetic quartz glass substrate to form a recess, channel or step therein, a machining center or numerically controlled machine tool may be used. A grinding wheel is rotated and moved on a substrate surface to be worked under conditions that may not cause any crack, flaw or chips whereby a recess, channel or step of predetermined size and depth is formed. Preferably the first, second and third chamfers 5, 6 and 7 are formed at the same time.

Specifically, a grinding wheel having diamond or CBN abrasives electroplated or metal bonded is used and operated at a spindle rotational frequency of 100 to 30,000 rpm, preferably 1,000 to 15,000 rpm and a cutting speed of 1 to 10,000 mm/min, preferably 10 to 1,000 mm/min.

The grinding wheel and machining conditions are preferably selected such that when a recess, channel or step is formed by machining, the bottom and side surfaces of the recess, channel or step and the chamfers may have a surface roughness Ra of 2 to 500 nm, more preferably 2 to 100 nm. Further preferably the bottom surface has a parallelism of up to 90 µm, even more preferably 1 to 40 µm and a flatness of 0.01 to 20 µm, even more preferably 0.01 to 10 µm.

The subsequent step of polishing the machined surface, that is, the bottom and side surfaces of the recess, channel or step and the chamfers to mirror finish is carried out by contacting a working portion of a rotary polishing tool with the bottom and side surfaces and the chamfers under independent constant pressures and relatively moving the tool at a constant speed. By polishing at a constant pressure and a constant speed, the machined surface can be uniformly polished at a constant polishing rate. Specifically, the pressure under which a working portion of a rotary polishing tool is kept in contact with the machined surface is preferably in a range of 1 to 1,000,000 Pa, more preferably 1,000 to 100,000 Pa, from the standpoints of economy and ease of control.

Also from the standpoints of economy and ease of control, the polishing speed is preferably in a range of 1 to 10,000 mm/min, more preferably 10 to 1,000 mm/min. The moving quantity may be determined in accordance with the shape and size of the glass substrate.

The rotary polishing tool may be of any type as long as its working portion is an abrasive rotary component. Examples include a spindle having a tool chucking portion or a precision grinder having a polishing tool mounted thereon (e.g., Leutor).

The type of material used in the polishing tool is not particularly limited as long as the working portion is a cerium pad, rubber wheel, felt buff, polyurethane or other component capable of working and removing workpiece stock and has a Young's modulus of preferably up to 7 GPa, more preferably up to 5 GPa. On use of the polishing tool with a working portion made of a material having a Young's modulus of up to 7 GPa, the working portion may be deformed by the pressure so as to follow the profile of the chamfers of the recess, channel or step, ensuring that the chamfers are polished to mirror finish at the same time as the bottom and side surfaces are.

Figure 11:
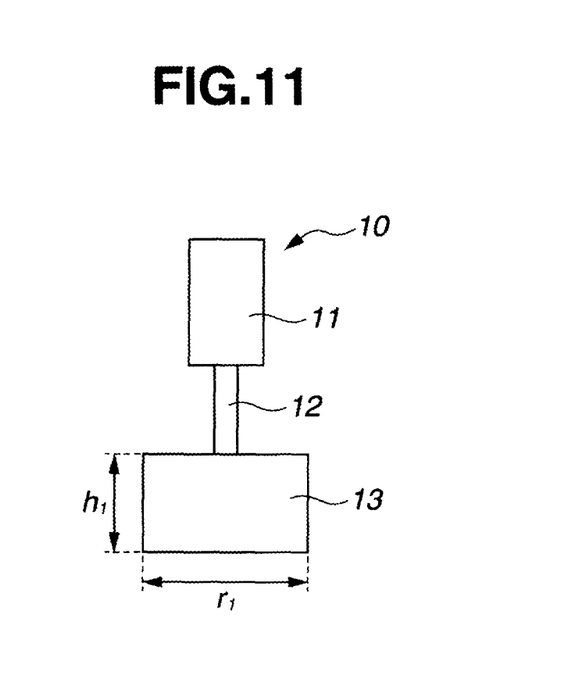
FIG. 11 is a schematic view of one exemplary rotary polishing tool.

The working portion of the rotary polishing tool may have any shape including circular or doughnut flat plate, cylinder, bombshell, disk and barrel shapes. For example, FIG. 11 shows an exemplary polishing tool 10 comprising a piston 11, a rotating shaft 12 received for axial motion in the piston 11 and rotated by a rotational drive, typically motor, and a working portion 13 attached to the end of the shaft. In order to polish the bottom and side surfaces of the recess, channel or step at the same time, the height ($h_1$ in FIG. 11) of the working portion 13 in contact with the side surface should preferably be equal to or more than the height ($h_0$ in FIG. 2) of the side surface. Likewise, the diameter ($r_1$ in FIG. 11) of the working portion 13 should preferably be equal to or more than half of the diameter ($r_0$ in FIG. 2) of the recess (i.e., $r_1 \geq r_0/2$) if the recess is circular, or half of the minor diameter of the recess (i.e., $r_1 \geq r_0/2$) if the recess is ellipsoidal or oval, half of the width of the channel (i.e., $r_1 \geq W_1/2$), or the width of the step (i.e., $r_1 \geq W_2$).

When the recess, channel or step is polished by the rotary polishing tool with its working portion in contact with the machined surfaces (bottom and side surfaces and chamfers), a polishing abrasive slurry is preferably delivered to the polishing site. Examples of suitable abrasive grains used herein include silica, ceria, Alundum, white Alundum (WA), emery, zirconia, SiC, diamond, titania, and germania. The grain size is preferably in a range of 10 nm to 10 µm. A water slurry of such abrasives may be used.

The relative moving speed of the rotary polishing tool may be selected in the range of 1 to 10,000 mm/min, more preferably 10 to 1,000 mm/min as described above. The rotational frequency of the working portion of the rotary polishing tool is preferably in the range of 100 to 10,000 rpm, more preferably 1,000 to 8,000 rpm, and even more preferably 2,000 to 7,000 rpm. A lower rotational frequency may lead to a lower polishing rate, taking a too long time until the machined surface is mirror finished. A higher rotational frequency may lead to a higher polishing rate or excessive abrasion of the working portion, causing difficult control of mirror finishing.

When the bottom and side surfaces of the recess, channel or step and the chamfered portions are polished to mirror finish according to the inventive method, independent pressure control mechanisms may be used for keeping the working portion of the rotary polishing tool in contact with the bottom and side surfaces and the chamfers under independent constant pressures. The pressure control mechanism used herein may be a pneumatic piston or load cell. In the case of the rotary polishing tool of FIG. 11, for example, the pressure of contact between the working portion and the bottom surface can be adjusted by adjusting the pressure of the pneumatic piston 11. Also, in the case of the rotary polishing tool of FIG. 11, a second piston may be coupled to the pneumatic piston 11 for moving the piston 11 toward and away from the side surface of the recess, channel or step. Then the pressure of contact between the working portion and the side surface can be adjusted by adjusting the pressure of the second piston. An alternative system for adjusting the pressure of contact between the working portion and the side surface includes another piston having a shaft and a substrate-holding platform for holding the substrate, with the shaft of the other piston being coupled to the platform, whereby the pressure of the shaft is adjusted to adjust a lateral pressure for controlling the motion of the substrate-holding platform. By using a single rotary polishing tool and independent pressure control mechanisms to the bottom and side surfaces, bringing the working portion in contact with the bottom and side surfaces under independent constant pressures, and relatively moving the tool at a constant speed, the bottom and side surfaces can be concurrently polished uniformly at independent polishing rates.

It may be contemplated that the bottom and side surfaces of the recess, channel or step are polished separately in succession rather than concurrently. However, this procedure is less desired in that since the working portion of the rotary polishing tool in contact with the bottom or side surface can come in contact with the side and bottom surfaces at the same time, the polishing of these surfaces becomes non-uniform, and a longer polishing time is necessary.

According to one embodiment of the method of the invention, in the step of polishing the bottom and side surfaces to mirror finish, the rotary polishing tool and the substrate are relatively moved such that the working portion may follow the profile of the recess, channel or step and chamfers in the substrate. The mode of movement may be of any type as long as it can control the quantity, direction and speed of movement constant. For example, a multi-axis robot may be used.

The rotary polishing tool and the substrate may be relatively moved by rotating the rotary polishing tool about the recess or rotating the substrate or by moving the rotary polishing tool or the substrate along at least one straight axis, such that the working portion may follow the profile of the recess, channel or step and the chamfers.

In the embodiment wherein the surfaces of the recess, channel or step and the chamfers are polished to mirror finish by rotating the rotary polishing tool about the recess or rotating the substrate such that the working portion may follow the profile of the recess, channel or step and the chamfers, any mechanism capable of controlling the rotational frequency and speed constant may be used. For example, a motor spindle is used to rotate the rotary polishing tool or a substrate-holding platform at a frequency of 0.1 to 10,000 rpm, especially 1 to 100 rpm, and a speed of 1 to 10,000 mm/min, especially 10 to 1,000 mm/min. This embodiment is useful particularly when the bottom and side surfaces of a recess of circular or ellipsoidal shape or a channel or step having curved walls are uniformly polished at independent constant pressures and constant speeds to mirror finish.

In the other embodiment wherein the surfaces of the recess, channel or step and the chamfers are polished to mirror finish by moving the rotary polishing tool or the substrate along at least one straight axis such that the working portion may follow the profile of the recess, channel or step and the chamfers, any mechanism capable of controlling the quantity and speed of movement constant. For example, a servo motor is used to move the rotary polishing tool or a substrate-holding platform on a slider at a speed of 1 to 10,000 mm/min, especially 10 to 1,000 mm/min. This embodiment is useful particularly when the bottom and side surfaces of a recess of rectangular shape or a channel or step having planar walls are uniformly polished at constant pressures and constant speeds to mirror finish.

If necessary, the substrate after mirror finish polishing may be inspected for the presence of defects, flaws or cracks on the bottom surface of the recess, channel or step and any surrounding region. Any desired inspection means may be used as long as defects, flaws or cracks having a depth of at least 200 nm and a width of at least 1 µm can be detected. Suitable inspection means include visual observation under a high intensity lamp, microscopic observation, and a laser flaw detector.

After mirror finish polishing, the bottom and side surfaces of the recess, channel or step and the chamfers preferably have a mirror finish as demonstrated by a surface roughness Ra of up to 1 nm, more preferably up to 0.5 nm. If the bottom and side surfaces of the recess, channel or step are not mirror finished, little light may be transmitted leading to exposure failure, or contaminants may deposit thereon to obstruct transmittance of light or detrimentally affect the pattern. It is noted that the surface roughness Ra is determined according to JIS B-0601.

Now that the bottom and side surfaces of the recess, channel or step have been polished to mirror finish, the strength of the bottom wall is significantly increased. Since the curvilinear chamfered portion is provided between the side and bottom surfaces of the recess, channel or step, the portion extending from the side surface to the bottom surface which receives the maximum stress when a load is applied to the bottom wall has a certain thickness and a sufficient degree of mirror finish and as a result, the strength of the bottom wall is further increased. Thus the substrate is not broken even when a load in a certain range is applied to the bottom surface of the recess, channel or step to introduce a change in the shape of the bottom surface. Specifically the bottom wall does not fail upon receipt of a stress of up to 100 $MNm^{-2}$, more specifically 5 to 50 $MNm^{-2}$, and even more specifically 5 to 20 $MNm^{-2}$. Even when such loads are repeatedly applied, the bottom wall remains durable and resistant to breakage.

The term "load in a certain range" refers, in the case of a circular recess having a bottom wall thickness of h (mm) and a diameter of a (mm), for example, to a uniformly distributed load of up to about $1.3 \times 10^8 \times h^2/a^2$ Pa, more specifically $7.0 \times 10^6 \times h^2/a^2$ to $7.0 \times 10^7 \times h^2/a^2$ Pa, and even more specifically $7.0 \times 10^6 \times h^2/a^2$ to $3.0 \times 10^7 \times h^2/a^2$ Pa, across the overall bottom surface. When such a load is applied, the bottom surface receives a stress of up to 100 $MNm^{-2}$. Likewise, in the case of a channel having a bottom wall thickness of h (mm), a width of a (mm), and a length of b (mm), when a concentrated load of up to about $30 \times b/a \times h^2$ N, more specifically $1 \times b/a \times h^2$ to $15 \times b/a \times h^2$ N, and even more specifically $1 \times b/a \times h^2$ to $6 \times b/a \times h^2$ N is applied to the channel bottom surface at the center, the bottom surface receives a stress of up to 100 $MNm^2$. In the case of a step having a bottom wall thickness of h (mm), a width of a (mm), and a length of b (mm) wherein b>3a, when a concentrated load of up to about $32 \times h^2$ N, more specifically $1 \times h^2$ to $16 \times h^2$ N, and even more specifically $1 \times h^2$ to $6 \times h^2$ N is applied to the step free edge at the center, the bottom surface receives a stress of up to 100 $MNm^{-2}$. A uniformly distributed load can be applied to the recess bottom surface by an experimental pneumatic or hydraulic press capable of applying a selected pressure over a selected number of cycles and increasing or decreasing the pressure. A concentrated load can be applied to the bottom surface at the predetermined position by an experimental pressure applicator having a pointed bar or probe and capable of applying a selected pressure over a selected number of cycles.

It is preferred from the aspect of clamping the substrate that the bottom surface of the recess, channel or step which has been polished to mirror finish have a flatness of 0.01 to 40 µm more preferably 0.01 to 10 µm and even more preferably 0.01 to 5 µm. A poor flatness outside the range may make it difficult to hold the substrate accurately parallel to the reference when the substrate is mounted in a lithography or patterning apparatus by clamping the substrate at the bottom surface of the recess, channel or step. A poor flatness also has the problem that a fluid (gas or liquid) may not flow smoothly when the fluid is fed in or out through the recess, channel or step.

It is preferred from the standpoint of a pattern shift that the bottom surface of the recess, channel or step have a parallelism of up to 100 µm, more preferably up to 50 µm, and even more preferably up to 10 µm. If the bottom surface parallelism is poor, it may become difficult to deform the recess, channel or step in a fully symmetrical pattern when the recess, channel or step is deformed for resin imprinting, or it may become difficult to hold the substrate accurately parallel to the reference when the substrate is mounted in a patterning apparatus by clamping the substrate at the bottom surface of the recess, channel or step, leaving the risk of a focal shift or pattern shift.

EXAMPLE

Examples of the invention are given below by way of illustration and not by way of limitation.

Example 1

A synthetic quartz glass substrate A dimensioned 100 mm×100 mm×6.35 mm (thick) having front, back and end surfaces polished to mirror finish was prepared as a starting substrate. Using a machining center and a diamond abrasive wheel, the starting substrate was machined at the center of its back surface to form a circular recess with a depth of 5.32 mm and a diameter of 69.98 mm, having a first chamfer with a width of 0.3 mm between the recess side surface and the substrate back surface.

Next, the machined substrate was fixedly mounted on a platform. A wool felt buff having a diameter of 50 mm and a height of 30 mm adapted to rotate at 1,000 rpm was forced in contact with the bottom surface of the recess under 3,500 Pa and the side surface under 2,000 Pa. The substrate-holding platform was rotated at 10 rpm, whereby the surfaces were polished for 60 minutes to mirror finish. The recess (or counterbore) in the glass substrate as polished had a depth of 5.35 mm with a bottom wall thickness of 1.00 mm, and a diameter of 70 mm, and the first chamfer had a width of 0.4 mm.

When a region extending from the side surface of the recess to the back surface was observed under a microscope, no fine fissure or chipping was found.

The mirror finished glass substrate A was measured for parallelism, flatness of front and back surfaces, and surface roughness Ra of front, back and end surfaces.

| | | |
|---|---|---|
| Parallelism | | 0.6 μm |
| Front surface | flatness | 0.212 μm |
| | Ra | 0.14 nm |
| Back surface | flatness | 0.355 μm |
| | Ra | 0.16 nm |
| End surface | Ra | 0.84 nm |

Notably, flatness and parallelism were measured by Zygo Mark IVxP by Zygo, and Ra measured by atomic force microscopy.

The bottom surface of the recess formed in the back surface of the glass substrate A prior to mirror finish polishing was measured for parallelism, flatness, and surface roughness Ra, and the side wall of the recess and the first chamfer measured for surface roughness Ra.

| | | |
|---|---|---|
| Bottom surface | parallelism | 9 μm |
| | flatness | 3 μm |
| | Ra | 7.06 nm |
| Side wall | Ra | 8.08 nm |
| First chamfer | Ra | 6.93 nm |

Notably, flatness and parallelism could not be measured by Zygo Mark IVxP by Zygo, but by a micrometer. Ra was measured by atomic force microscopy.

The bottom surface of the recess after mirror finish polishing was measured for parallelism, flatness, and surface roughness Ra, and the side wall of the recess and the first chamfer measured for surface roughness Ra.

| | | |
|---|---|---|
| Bottom surface | parallelism | 10 μm |
| | flatness | 4 μm |
| | Ra | 0.30 nm |
| Side wall | Ra | 0.39 nm |
| First chamfer | Ra | 0.81 nm |

Example 2

A synthetic quartz glass substrate A dimensioned 100 mm×100 mm×6.35 mm (thick) having front, back and end surfaces polished to mirror finish was prepared as a starting substrate. Using a machining center and a diamond abrasive wheel, the starting substrate was machined at the center of its back surface to form a circular recess with a depth of 5.32 mm and a diameter of 69.98 mm, having a curvilinear second chamfer with a radius of curvature of 1.5 mm between the recess side and bottom surfaces and a first chamfer with a width of 0.3 mm between the recess side surface and the substrate back surface.

Next, the machined substrate was fixedly mounted on a platform. A wool felt buff having a diameter of 50 mm and a height of 30 mm adapted to rotate at 1,000 rpm was forced in contact with the bottom surface of the recess under 3,500 Pa and the side surface under 2,000 Pa. The substrate-holding platform was rotated at 10 rpm, whereby the surfaces were polished for 60 minutes to mirror finish. The recess (or counterbore) in the glass substrate as polished had a depth of 5.35 mm with a bottom wall thickness of 1.00 mm, and a diameter of 70 mm, the curvilinear second chamfer had a radius of curvature of 1.6 mm, and the first chamfer had a width of 0.4 mm.

The mirror finished glass substrate A was measured for parallelism, flatness of front and back surfaces, and surface roughness Ra of front, back and end surfaces.

| | | |
|---|---|---|
| Parallelism | | 0.6 μm |
| Front surface | flatness | 0.154 μm |
| | Ra | 0.13 nm |
| Back surface | flatness | 0.325 μm |
| | Ra | 0.15 nm |
| End surface | Ra | 0.76 nm |

Notably, flatness and parallelism were measured by Zygo Mark IVxP by Zygo, and Ra measured by atomic force microscopy.

The bottom surface of the recess formed in the back surface of the glass substrate A prior to mirror finish polishing was measured for parallelism, flatness, and surface roughness Ra, and the side wall of the recess and the second and first chamfers measured for surface roughness Ra.

| | | |
|---|---|---|
| Bottom surface | parallelism | 8 μm |
| | flatness | 3 μm |
| | Ra | 6.48 nm |
| Side wall | Ra | 7.40 nm |

| Second chamfer | Ra | 4.61 nm |
| --- | --- | --- |
| First chamfer | Ra | 5.77 nm |

Notably, flatness and parallelism could not be measured by Zygo Mark IVxP by Zygo, but by a micrometer. Ra was measured by atomic force microscopy.

The bottom surface of the recess after mirror finish polishing was measured for parallelism, flatness, and surface roughness Ra, and the side wall of the recess and the second and first chamfers measured for surface roughness Ra.

| Bottom surface | parallelism | 9 μm |
| --- | --- | --- |
|  | flatness | 4 μm |
|  | Ra | 0.28 nm |
| Side wall | Ra | 0.29 nm |
| Second chamfer | Ra | 1.24 nm |
| First chamfer | Ra | 0.81 nm |

Notably, flatness and parallelism were measured by Zygo Mark IVxP by Zygo, and Ra measured by atomic force microscopy.

Likewise, fifty (50) synthetic quartz glass substrates were manufactured by machining a recess and mirror finish polishing the recess under equivalent conditions. The recesses had a depth of 5.35±0.01 mm and a diameter of 70±0.01 mm.

By visual observation under a high intensity lamp, the substrates were found to contain no cracks. A durability test was carried out on the recess by repeating 50,000 cycles, each cycle consisting of vacuuming to −15 kPa and resuming atmospheric pressure. For all 50 substrates, the bottom surface of the recess was devoid of breakage.

Before and after the durability test, a stress test was carried out on the substrate by vacuuming the recess to −50 kPa to apply a stress of about 46 MNm$^{-2}$ to the bottom surface. For all 50 substrates, the bottom surface of the recess was devoid of breakage.

Example 3

A synthetic quartz glass substrate B dimensioned 152 mm×152 mm×6.35 mm (thick) having front, back and end surfaces polished to mirror finish was prepared as a starting substrate. Using a machining center and a diamond abrasive wheel, the starting substrate was machined at the center of its back surface to form a channel having a depth of 4.98 mm, a width of 29.9 mm, and a length of 152 mm, extending parallel to the end surface, and having a curvilinear second chamfer with a radius of curvature of 0.9 mm between the channel side and bottom surfaces and a first chamfer with a width of 0.3 mm between the channel side surface and the back surface.

Next, the machined substrate was fixedly mounted on a platform. A wool felt buff having a diameter of 30 mm and a height of 30 mm adapted to rotate at 1,000 rpm was forced in contact with the bottom surface of the channel under 2,000 Pa and one side wall under 2,000 Pa. The substrate-holding platform was moved back and forth at 50 mm/min over 5 strokes. With the buff forced in contact with the bottom surface and the other side wall under the same pressures, the substrate-holding platform was moved back and forth at 50 mm/min over 5 strokes. In this way, the surfaces were polished to mirror finish. The channel in the glass substrate as polished had a depth of 5 mm and a width of 30.1 mm, the curvilinear second chamfer had a radius of curvature of 1.0 mm, and the first chamfer had a width of 0.4 mm.

The mirror finished glass substrate B was measured for parallelism, flatness of front and back surfaces, and surface roughness Ra of front, back and end surfaces.

| Parallelism |  | 0.9 μm |
| --- | --- | --- |
| Front surface | flatness | 0.252 μm |
|  | Ra | 0.15 nm |
| Back surface | flatness | 0.471 μm |
|  | Ra | 0.18 nm |
| End surface | Ra | 0.68 nm |

The bottom surface of the channel formed in the back surface of the glass substrate B prior to mirror finish polishing was measured for parallelism, flatness, and surface roughness Ra, and the side wall of the channel and the second and first chamfers measured for surface roughness Ra.

| Bottom surface | parallelism | 13 μm |
| --- | --- | --- |
|  | flatness | 5 μm |
|  | Ra | 7.51 nm |
| Side wall | Ra | 8.97 nm |
| Second chamfer | Ra | 5.73 nm |
| First chamfer | Ra | 7.82 nm |

The bottom surface of the channel after mirror finish polishing was measured for parallelism, flatness, and surface roughness Ra, and the side wall of the channel and the second and first chamfers measured for surface roughness Ra.

| Bottom surface | parallelism | 16 μm |
| --- | --- | --- |
|  | flatness | 8 μm |
|  | Ra | 0.58 nm |
| Side wall | Ra | 0.63 nm |
| Second chamfer | Ra | 1.01 nm |
| First chamfer | Ra | 0.78 nm |

Likewise, fifty (50) synthetic quartz glass substrates were manufactured by machining a channel and mirror finish polishing the channel under equivalent conditions. The channels had a depth of 5±0.01 mm and a width of 30±0.01 mm.

By visual observation under a high intensity lamp, the substrates were found to contain no cracks. A durability test was carried out on the channel by repeating 10,000 cycles, each cycle consisting of applying a load of 10 N to the channel bottom at the center and returning the load to zero. For all 50 substrates, the bottom surface of the channel was devoid of breakage.

Before and after the durability test, a stress test was carried out on the substrate by applying a load of 50 N to produce a stress of about 20 MNm$^{-2}$ to the bottom surface at the center. For all 50 substrates, the bottom surface of the channel was devoid of breakage.

Example 4

A synthetic quartz glass substrate C dimensioned 200 mm×400 mm×10 mm (thick) having front, back and end surfaces polished to mirror finish was prepared as a starting substrate. Using a machining center and a diamond abrasive wheel, the starting substrate was machined on its back surface along both short sides to form steps having a depth of 6.95 mm, a width of 19.99 mm, and a length of 200 mm, and having a curvilinear second chamfer with a radius of curvature of 2.0 mm between the side and bottom surfaces, a first chamfer with a width of 0.5 mm between the side surface and the back surface, and a third chamfer with a width of 0.5 mm between the bottom surface and the substrate end surface.

Next, the machined substrate was fixedly mounted on a platform. A wool felt buff having a diameter of 30 mm and a height of 30 mm adapted to rotate at 1,000 rpm was forced in contact with the bottom surface of the step under 2,000 Pa and the side wall under 2,000 Pa. The substrate-holding platform was moved back and forth at 200 mm/min over 5 strokes. In this way, the surfaces of both side steps were polished to mirror finish. The step in the glass substrate as polished had a depth of 7 mm and a width of 20 mm. The curvilinear second chamfer had a radius of curvature of 2.1 mm, and the first and third chamfers had a width of 0.6 mm. The mirror finished glass substrate C was measured for parallelism, flatness of front and back surfaces, and surface roughness Ra of front, back and end surfaces.

| Parallelism | | 5.3 μm |
|---|---|---|
| Front surface | flatness | 2.085 μm |
| | Ra | 0.18 nm |
| Back surface | flatness | 3.193 μm |
| | Ra | 0.21 nm |
| End surface | Ra | 0.74 nm |

The bottom surface of the steps formed in the back surface of the glass substrate C prior to mirror finish polishing was measured for parallelism, flatness, and surface roughness Ra, and the side wall of the steps, curvilinear second chamfer, first and third chamfers measured for surface roughness Ra.

| Bottom surface | parallelism | 14 μm and 19 μm |
|---|---|---|
| | flatness | 7 μm and 9 μm |
| | Ra | 10.49 nm |
| Side wall | Ra | 9.54 nm |
| Second chamfer | Ra | 5.89 nm |
| First chamfer | Ra | 4.97 nm |
| Third chamfer | Ra | 6.90 nm |

Note that the first chamfer is disposed between step side surface and substrate back surface, and the third chamfer disposed between step bottom surface and substrate end surface.

The bottom surface of the steps after mirror finish polishing was measured for parallelism, flatness, and surface roughness Ra, and the side wall of the steps, curvilinear second chamfer, first and third chamfers measured for surface roughness Ra.

| Bottom surface | parallelism | 16 μm and 20 μm |
|---|---|---|
| | flatness | 8 μm and 10 μm |
| | Ra | 0.21 nm |
| Side wall | Ra | 0.25 nm |
| Second chamfer | Ra | 0.78 nm |
| First chamfer | Ra | 0.89 nm |
| Third chamfer | Ra | 0.78 nm |

When ten (10) synthetic quartz glass substrates were similarly manufactured, the steps had a depth of 7±0.01 mm and a width of 20±0.01 mm.

By visual observation under a high intensity lamp, the substrates were found to contain no cracks. A durability test was carried out on the steps by repeating 5,000 cycles, each cycle consisting of applying a load of 20 N to the step free edge at the center and returning the load to zero. For all 10 substrates, the bottom surface of the steps was devoid of breakage.

Before and after the durability test, a stress test was carried out on the substrate by applying a load of 50 N to produce a stress of about 17 $MNm^{-2}$ to the step free edge at the center. For all 10 substrates, the bottom surface of the step was devoid of breakage.

Comparative Example 1

A synthetic quartz glass substrate A dimensioned 100 mm×100 mm×6.35 mm (thick) having front, back and end surfaces polished to mirror finish was prepared as a starting substrate. Using a machining center and a diamond abrasive wheel, the starting substrate was machined at the center of its back surface to form a circular recess having a depth of 5.32 mm and a diameter of 69.98 mm.

Next, the machined substrate was fixedly mounted on a platform. A wool felt buff having a diameter of 35 mm and a height of 30 mm adapted to rotate at 1,000 rpm was forced in contact with the bottom surface of the recess under 3,500 Pa and the side surface under 2,000 Pa. The substrate-holding platform was rotated at 10 rpm, whereby the surfaces were polished for 60 minutes to mirror finish. The recess (or counterbore) in the glass substrate as polished had a depth of 5.35 mm with a bottom wall thickness of 1.00 mm, and a diameter of 70 mm.

When a region extending from the side surface of the recess to the back surface was observed under a microscope, chips with a maximum width of 0.2 mm were found over the entire recess circumference.

The mirror finished glass substrate A was measured for parallelism, flatness of front and back surfaces, and surface roughness Ra of front, back and end surfaces.

| Parallelism | | 0.6 μm |
|---|---|---|
| Front surface | flatness | 0.194 μm |
| | Ra | 0.23 nm |
| Back surface | flatness | 0.326 μm |
| | Ra | 0.25 nm |
| End surface | Ra | 0.99 nm |

Notably, flatness and parallelism were measured by Zygo Mark IVxP by Zygo, and Ra measured by atomic force microscopy.

The bottom surface of the recess formed in the back surface of the glass substrate A prior to mirror finish polishing was measured for parallelism, flatness, and surface roughness Ra, and the side wall of the recess measured for surface roughness Ra.

| Bottom surface | parallelism | 8 μm |
|---|---|---|
| | flatness | 4 μm |
| | Ra | 5.92 nm |
| Side wall | Ra | 7.06 nm |

Notably, flatness and parallelism could not be measured by Zygo Mark IVxP by Zygo, but by a micrometer. Ra was measured by atomic force microscopy.

The bottom surface of the recess after mirror finish polishing was measured for parallelism, flatness, and surface roughness Ra, and the side wall of the recess measured for surface roughness Ra.

| | | | |
|---|---|---|---|
| Bottom surface | parallelism | 9 | μm |
| | flatness | 5 | μm |
| | Ra | 0.24 | nm |
| Side wall | Ra | 0.33 | nm |

Notably, flatness and parallelism were measured by Zygo Mark IVxP by Zygo, and Ra measured by atomic force microscopy.

Likewise, fifty (50) synthetic quartz glass substrates were manufactured by machining a recess and mirror finish polishing the recess under equivalent conditions. The recesses had a depth of 5.35±0.01 mm and a diameter of 70±0.01 mm.

By visual observation under a high intensity lamp, three substrates among 50 substrates were found to contain cracks of perceivable size. For all 50 substrates, polishing marks were found between the side and bottom surfaces of the recess, which were assigned to shortage of mirror finishing. A durability test was carried out on the recess by repeating 50,000 cycles, each cycle consisting of vacuuming to −15 kPa and resuming atmospheric pressure. For seventeen (17) substrates among 50 substrates, the bottom surface of the recess was broken around 100 cycles of vacuuming.

A stress test was carried out on the remaining 33 substrates (devoid of breakage) by vacuuming the recess to −50 kPa to apply a stress of about 46 $MNm^{-2}$ to the bottom surface. For all 33 substrates, the bottom surface of the recess was broken.

Japanese Patent Application No. 2011-232522 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An electronic grade glass substrate comprising:
a recess, channel or step being disposed in at least one surface of the electronic grade glass substrate, the recess, channel or step having side and bottom surfaces, and
a first chamfer being provided between the side surface of the recess, channel or step and the one surface of the electronic grade glass substrate,
wherein the side and bottom surfaces of the recess, channel or step are mirror finished, and the first chamfer is mirror finished, and
wherein a third chamfer is provided between the bottom surface of the step and an end surface of the electronic grade glass substrate, and the third chamfer is mirror finished.

2. The electronic grade glass substrate of claim 1, wherein a second chamfer is provided between the side and bottom surfaces of the recess, channel or step, and the second chamfer is defined by a curved surface having a radius of curvature of 0.1 to 5.0 mm and mirror finished.

3. The electronic grade glass substrate of claim 1, wherein the side and bottom surfaces of the recess, channel or step and the chamfers have a surface roughness (Ra) of up to 1 nm.

4. An electronic grade glass substrate comprising:
a recess, channel or step being disposed in at least one surface of the electronic grade glass substrate, the recess, channel or step having side and bottom surfaces, and
a first chamfer being provided between the side surface of the recess, channel or step and the one surface of the electronic grade glass substrate,
wherein the side and bottom surfaces of the recess, channel or step are mirror finished, and the first chamfer is mirror finished, and
wherein the bottom surface of the recess, channel or step has a strength of at least 20 MPa.

5. The electronic grade glass substrate of claim 4, wherein the electronic grade glass substrate comprises synthetic quartz.

6. The electronic grade glass substrate of claim 4, further comprising a chromium film deposited on the electronic grade glass substrate.

7. The electronic grade glass substrate of claim 4, wherein, prior to the formation of the recess, channel or step, the electronic grade glass substrate has a flatness of 0.01 to 30 μm.

8. The electronic grade glass substrate of claim 4, wherein, prior to the formation of the recess, channel or step, the electronic grade glass substrate has a parallelism of 0.1 to 50 μm.

9. The electronic grade glass substrate of claim 4, wherein a second chamfer is provided between the side and bottom surfaces of the recess, channel or step, and the second chamfer is defined by a curved surface having a radius of curvature of 0.1 to 5.0 mm and mirror finished.

10. The electronic grade glass substrate of claim 4, wherein the side and bottom surfaces of the recess, channel or step and the chamfers have a surface roughness (Ra) of up to 1 nm.

11. An electronic grade glass substrate comprising:
a recess, channel or step being disposed in at least one surface of the electronic grade glass substrate, the recess, channel or step having side and bottom surfaces, and
a first chamfer being provided between the side surface of the recess, channel or step and the one surface of the electronic grade glass substrate,
wherein the side and bottom surfaces of the recess, channel or step are mirror finished, and the first chamfer is mirror finished, and
wherein the bottom surface of the recess, channel or step has a flatness of 0.01 to 40 μm.

12. The electronic grade glass substrate of claim 11, wherein a second chamfer is provided between the side and bottom surfaces of the recess, channel or step, and the second chamfer is defined by a curved surface having a radius of curvature of 0.1 to 5.0 mm and mirror finished.

13. The electronic grade glass substrate of claim 11, wherein the side and bottom surfaces of the recess, channel or step and the chamfers have a surface roughness (Ra) of up to 1 nm.

14. An electronic grade glass substrate comprising:
a recess channel or step being disposed in at least one surface of the electronic grade glass substrate, the recess, channel or step having side and bottom surfaces, and
a first chamfer being provided between the side surface of the recess, channel or step and the one surface of the electronic grade glass substrate,
wherein the side and bottom surfaces of the recess, channel or step are mirror finished, and the first chamfer is mirror finished, and
wherein the bottom surface of the recess, channel or step has a parallelism of up to 100 μm.

15. The electronic grade glass substrate of claim 14, wherein a second chamfer is provided between the side and bottom surfaces of the recess, channel or step, and the second chamfer is defined by a curved surface having a radius of curvature of 0.1 to 5.0 mm and mirror finished.

16. The electronic grade glass substrate of claim 14, wherein the side and bottom surfaces of the recess, channel or step and the chamfers have a surface roughness (Ra) of up to 1 nm.

* * * * *